United States Patent [19]

Schwalm et al.

[11] Patent Number: 5,084,371
[45] Date of Patent: Jan. 28, 1992

[54] POSITIVE-WORKING, RADIATION-SENSITIVE MIXTURE BASED ON ACID-CLEAVABLE AND PHOTOCHEMICALLY ACID-FORMING COMPOUNDS, AND THE PRODUCTION OF RELIEF PATTERNS AND RELIEF IMAGES

[75] Inventors: Reinhold Schwalm, Wachenheim; Horst Binder, Lampertheim; Rudolf Schuhmacher, Boehl-Iggelheim, all of Fed. Rep. of Germany

[73] Assignee: BASF Aktiengesellschaft, Ludwigshafen, Fed. Rep. of Germany

[21] Appl. No.: 338,092

[22] Filed: Apr. 14, 1989

[30] Foreign Application Priority Data

Apr. 14, 1988 [DE] Fed. Rep. of Germany ....... 3812326

[51] Int. Cl.$^5$ .......................... G03F 7/004; G03F 7/30
[52] U.S. Cl. .................... 430/270; 430/326; 430/330; 522/68
[58] Field of Search ............... 430/270, 176, 192, 290, 430/330, 326; 522/68

[56] References Cited

U.S. PATENT DOCUMENTS

| | | |
|---|---|---|
| 3,869,292 | 3/1975 | Peters . |
| 3,915,706 | 10/1975 | Limburg et al. . |
| 3,923,514 | 12/1975 | Marsh . |
| 4,377,631 | 3/1983 | Toukhy et al. . |
| 4,678,737 | 7/1987 | Schneller et al. ............ 430/270 |
| 4,770,977 | 10/1988 | Buiguez et al. ............ 430/270 |
| 4,789,619 | 12/1988 | Ruckert et al. ............ 430/171 |
| 4,797,348 | 1/1989 | Nakamura et al. ............ 430/192 |
| 4,804,612 | 2/1989 | Asaumi et al. ............ 430/192 |
| 4,820,607 | 4/1989 | Aoai ............ 430/190 |
| 4,883,740 | 11/1989 | Schwalm et al. ............ 430/270 |

FOREIGN PATENT DOCUMENTS 0164248  5/1985  European Pat. Off. .......... 430/326

OTHER PUBLICATIONS

Journal of Imaging Technology, vol. 11, No. 4, Aug. 1985, pp. 146-157.
Kaplan, L. H., Exposure Time Reduction for Positive Photoresists, 1970, vol. 13, No. 2.
Batchelder, Tom and Piatt, John, Bake Effects in Positive Photoresist.
Novolac Resins Used in Positive Resist Systems—Pampalone—"Solid State Technology", Jun. 1984, pp. 115-120.
Evaluation of Pure Novolak Cresol-Formaldehyde Resins for Deep U.V. Lithography, Gipstein et al, J. Electrochemical Soc., 129 (1982), pp. 201-205.
Phenolic Resins, Springer Verlag (1985), Knop and Pilato.
U.S. Ser. No. 214,011, Sulfonium Salts Having Acid-Labil Groups—Schwalm et al.

Primary Examiner—Charles L. Bowers, Jr.
Assistant Examiner—John S. Y. Chu
Attorney, Agent, or Firm—Keil & Weinkauf

[57] ABSTRACT

A positive-working, radiation-sensitive mixture and a process for the production of relief images.

The radiation-sensitive mixture contains
(a) a water-insoluble polymeric binder which is soluble or at least dispersible in aqueous alkaline solutions and
(b) an organic compound whose solubility in an aqueous alkaline developer is increased by the action of an acid and which contains one or more acid-cleavable groups and in addition a further group which produces a strong acid on exposure to radiation, the polymeric binder (a) consisting a mixture of a phenolic polymer and a resin of the novolak type.

The novel mixture is particularly suitable for the production of photoresists.

6 Claims, No Drawings

POSITIVE-WORKING, RADIATION-SENSITIVE MIXTURE BASED ON ACID-CLEAVABLE AND PHOTOCHEMICALLY ACID-FORMING COMPOUNDS, AND THE PRODUCTION OF RELIEF PATTERNS AND RELIEF IMAGES

The present invention relates to positive-working, radiation-sensitive mixtures which contain (a) a binder which is soluble in an aqueous alkaline medium and (b) a compound which contains one or more acid-cleavable bonds and forms a strong acid when exposed to radiation, the solubility of the compound (b) in an aqueous alkaline solvent being increased by the action of the acid. These mixtures are sensitive to UV, electron and X-ray radiation and are particularly suitable as resist materials.

Positive-working radiation-sensitive mixtures are known, and in particular positive-working resist materials which contain O-quinonediazides as solubility inhibitors in binders, eg. novolaks, which are soluble in aqueous alkaline media are used commercially as photoresists. However, the sensitivity of these systems to radiation is unsatisfactory in some cases.

A dramatic increase in sensitivity in radiationsensitive systems is achieved if, in the primary photoreaction, a species is produced which then initiates a catalytic secondary reaction independently of the radiation and thus increases the quantum efficiency to above 1.

Such systems, which photochemically produce a strong acid and then eliminate acid-labile groups in a secondary reaction, are disclosed in, for example, U.S. Pat. No. 3,932,514 and U.S. Pat. NO. 3,915,706 for positive-working polyaldehydes.

Furthermore, radiation-sensitive mixtures which are based on acid-cleavable compounds and contain, as a binder, a polymer which is soluble in aqueous alkaline media, and also contain a compound which forms a strong acid photochemically and a further compound which has acid-cleavable bonds, have been disclosed (DE-A-3 406 927). Such 3-component systems are also known from the literature as X-ray resists (K. Dössel et al., Microcircuit Engineering, Interlaken 1986). In these mixtures, the binder contains a polymer having alkenylphenol units. The combination of these phenolic polymers with novolaks as binders is described as being unsuitable.

The photosensitive systems which are described in DE-A2 322 230 and contain various photosensitive compounds, for example O-quinonediazides, and polyvinyls, phenols, together with novolaks as binders, have not been used industrially to date.

An overview of the use of novolaks in positiveworking resists is given by T. Pampalone in Solid State Technology, June 1984, pages 115-120. This publication shows that polymers based on polyhydroxystyrene are less suitable since they entail the removal of an unacceptably large amount of material.

The use of novolaks based on p-cresol/formaldehyde resins for deep UV lithography is described by E. Gipstein in J. Electrochemical Soc., 129 (1982), 201-205. However, the use of pure novolaks based on p-cresol has the disadvantage that the softening ranges are relatively low.

Photoreactive components for deep UV lithography are, for example, those proposed in DE-A-3 721 740.

It is an object of the present invention to provide novel radiation-sensitive systems having high photoreactivity for the production of relief structures, which can be exposed in the short-wavelength UV range below 300 nm, ie. deep UV.

We have found that binders based on polyvinylphenols can advantageously be used for exposure in the deep UV range if not more than 40% by weight of a novolak based on a p-alkylphenol/formaldehyde resin is used in combination with not more than 20% by weight of a photoreactive compound which is based on a sulfonium salt and ha acid-labile groups in the molecule.

These mixtures are ideal for exposure in the deep UV range, in particular for exposure to an excimer laser having a wavelength of 248 nm, since the optical density of these binders is substantially less than 1 per micrometer of layer thickness. Furthermore the mixtures have very high sensitivity since the photoreaction is assisted by a catalytic secondary reaction which increases the quantum efficiency to above 1.

The present invention relates to a radiationsensitive mixture which contains
(a) a water-insoluble polymeric binder which is soluble or at least dispersible in aqueous alkaline solutions and
(b) an organic compound whose solubility in an aqueous alkaline developer is increased by the action of an acid and which contains one or more acid-cleavable groups and in addition a further group which produces a strong acid on exposure to radiation, wherein the polymeric binder (a) contains a mixture of a phenolic polymer having a molecular weight of from 1,000 to 250,000 and a resin of the novolak type having a molecular weight of from 300 to 20,000.

The phenolic polymer of component (a) is preferably poly-(p-hydroxystyrene), poly-(p-hydroxy-α-methylstyrene) or a copolymer of p-hydroxystyrene and p-hydroxy-α-methylstyrene, and the resin of the novolak type of component (a) is preferably a p-alkylphenol/formaldehyde novolak resin or a predominantly o,o'-bonded phenol/formaldehyde novolak resin.

The compound (b) is preferably a sulfonium salt of the general formula (I)

where $R^1$ to $R^3$ are identical or different and are aliphatic and/or aromatic radicals which may contain heteroatoms, or two of the radicals $R^1$ to $R^3$ are bonded to one another to form a ring, with the proviso that one or more of the radicals $R^1$ to $R^3$ contain one or more acidcleavable groups, and X is a non-nucleophilic counter-ion.

The novel radiation-sensitive mixture preferably contains
($a_1$) from 40 to 90% by weight of the phenolic polymer,
($a_2$) from 5 to 40% by weight of a resin of the novolak type and
(b) from 5 to 20% by weight of a sulfonium salt of the formula (I), with the proviso that the sum of the percentages stated under ($a_1$), ($a_2$) and (b) is 100, and the solids content of the mixture in an organic solvent may be from 5 to 40% by weight.

The present invention furthermore relates to a process for the production of relief patterns and relief images, wherein a novel radiation-sensitive mixture is used as the photosensitive coating material and, after exposure, may be heated to 60°-120° C.

Radiation-sensitive mixtures according to the present invention thus consist of polymeric binders which are insoluble in water but soluble or dispersible in aqueous alkaline solvents and are based on a mixture of a phenolic polymer and a resin of the novolak type and a compound which contains the acid-cleavable groups and forms a strong acid on irradiation. This radiation-sensitive mixture is generally applied in the form of a thin film to a substrate, heated under controlled conditions to remove the residual solvent, exposed imagewise and reheated under controlled conditions. As a result of this treatment, the solubility of the imagewise exposed areas is changed in such a way that complete removal with alkaline or polar solvents occurs, whereas the unexposed areas show only slight removal of material.

These radiation-sensitive mixtures are sensitive to X-ray, electron and short-wavelength UV radiation and can be rendered sensitive to visible light by adding a sensitizer.

In the present invention, all compounds (b) which form an acid on exposure to radiation and contain acid-labile groups may be used in conjunction with alkali-soluble binders, although sulfonium salts of the general formula (I)

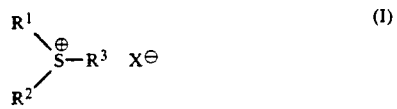

where $R^1$ to $R^3$ are identical or different and are aromatic and/or aliphatic radicals which may contain heteroatoms, with the proviso that one or more of the radicals $R^1$ to $R^3$ contain an acid-cleavable group, for example a tert-butylcarbonate of a phenol or a silyl ether of a phenol, are preferred. The abovementioned acid-labile groups are preferred, but a large number of other acidlabile groups, such as the known tetrahydropyranyl ether, ortho-ester, trityl and benzyl groups, and tert-butyl esters of carboxylic acids may also be used. Furthermore, two or more sulfonium units may be linked in the molecule via the radicals $R^1$ to $R^3$.

The polymeric binders used according to the invention are mixtures of those alkali-soluble polymers which have a high content of aromatic groups, ie. novolaks and substituted poly-(p-hydroxystyrenes). Binders having a high content of aromatic groups have the advantage of being relatively stable in plasma and reactive ion etching processes.

For use in deep UV lithography, the radiationsensitive mixture must contain both a phenolic polymer based on polyvinylphenol and a p-cresol/formaldehyde or predominantly o,o'-bonded phenol/formaldehyde novolak, since one of these components alone does not give the desired properties.

The phenolic polymer contains units of the general formula (II)

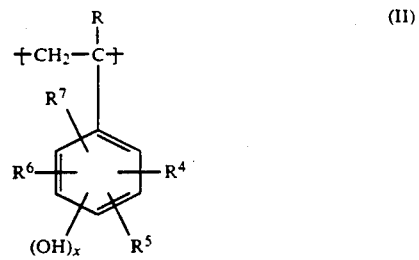

where R is hydrogen or halogen or alkyl of 1 to 4 carbon atoms, $R^4$, $R^5$, $R^6$ and $R^7$ are each hydrogen, halogen or alkyl or alkoxy, each of 1 to 4 carbon atoms, and x is from 1 to 3, preferably 1.

Particularly preferred are those polymers of the formula (II) in which R is hydrogen or methyl and $R^4$ to $R^7$ are each hydrogen and the hydroxyl group is in the p-position.

These polymers generally have molecular weights ($M_n$) of from 1,000 to 250,000, preferably from 10,000 to 80,000, and are present in the radiation-sensitive mixture in an amount of from 40 to 90, preferably from 60 to 80, % by weight.

Suitable novolaks are the known cresol/formaldehyde types or phenol/formaldehyde types, as described in, for example, U.S. Pat. No. 4 377 631. The synthesis of the novolaks is also described in, for example, A. Knop and L. Pilato, Phenolic Resins, Springer Verlag (1985).

However, types containing units of the general formula (III)

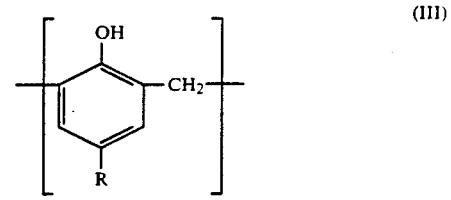

where R is hydrogen or alkyl, preferably methyl, are particularly preferably used in deep UV lithography. Novo-laks of these types having a molecular weight of from 300 to 20,000, preferably from 400 to 2,000, are suitable.

Preferred compounds having acid-cleavable groups are the sulfonium salts described in DE-A-3 721 740 and of the general formula ($I_g$)

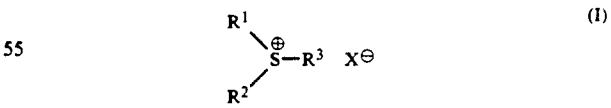

where $R^1$ to $R^3$ are each, for example, 4-tert-butoxycarbonyloxyphenyl, 4-tert-butoxycarbonyloxy-3,5-dimethylphenyl, 4-tert-butoxycarbonyloxy-3-methylphenyl, 4-tertbutoxycarbonyloxy-2-methylphenyl, 4-tert-butoxycarbonyloxy-3,5-dimethoxyphenyl, 4-tert-butoxycarbonyloxy-3,5-diphenylphenyl, 1-tert-butoxycarbonyloxynaphthyl, 4-trimethylsilyloxyphenyl or 4-trimethylsilyloxynaphthyl, or $R^1$ is hydroxyphenyl and $R^2$ and $R^3$ may have the abovementioned meanings of $R^2$ and $R^3$.

Preferred counter-ions X⊖ are complex metal halides, such as tetrafluoborate, hexafluoroantimonate, hexafluoroarsenate and hexafluorophosphate, although the invention is restricted neither to these specific counter-ions nor to the stated compounds having acid-cleavable groups; instead, it is possible to use any compounds which form a strong acid on exposure to radiation and contain an acid-cleavable bond in the same molecule.

The novel mixtures are preferably dissolved in an organic solvent, the solids content being from 5 to 40% by weight. Preferred solvents are aliphatic ketones, ethers and esters, and mixtures of these. Alkylene glycol monoalkyl ethers, such as ethylcellosolve, butylglycol, methylcellosolve and 1-methoxy-2-propanol, alkylene glycol alkyl ether esters, such as methylcellosolve acetate, ethylcellosolve acetate, methylpropylene glycol acetate and ethylpropylene glycol acetate ketones, such as cyclohexanone, cyclopentanone and methyl ethyl ketone, and acetates, such as butyl acetate, and aromatics, such as toluene and xylene, are particularly preferred. The choice of the corresponding solvents or of mixtures of these depends on the choice of the particular phenolic polymer, the novolak and the photosensitive component.

Other additives, such as adhesion promoters, wetting agents, dyes and plasticizers may also be added.

If necessary, sensitizers may also be added in small amounts to render the compounds sensitive in the longer-wavelength UV range as far as the visible range. Polycyclic aromatics, such as pyrene and perylene, are preferred, although other dyes which act as sensitizers can also be used.

In the novel process for the production of relief patterns, a radiation-sensitive recording layer which consists of the novel radiation-sensitive mixture is subjected to imagewise exposure in a dose such that the solubility of the exposed areas in aqueous alkaline solvents increases and these exposed areas can be removed selectively using the alkaline developer. In the process, compounds having acid-cleavable groups, which, on exposure to radiation, likewise produce a strong acid which catalytically eliminates the acid-labile groups and thus increases the solubility of the compound in alkaline developers, are used in combination with the novel alkali-soluble binders.

For example, the polymeric binders (mixture of phenolic polymer and novolak resin) and from 5 to 20% by weight, based on the binder, of a sulfonium salt are dissolved in methylglycol acetate or methylpropylene glycol acetate, the solids content being from 10 to 30% by weight. The solution is advantageously passed through a filter having a pore diameter of 0.2 μm. By applying the resist solution by spincoating at speeds of from 1,000 to 10,000 rpm, it is possible to produce a resist film on a silicon wafer. The wafer is then usually heated for from 1 to 5 minutes at 90° C. or 80° C. The films thus obtained are exposed through a chromium-coated, structured quartz mask to UV light from a high pressure mercury lamp or to excimer laser light having a wavelength of 248 nm. The exposed films are generally heated for from 5 seconds to 2 minutes at from 60° to 100° C. The films treated in this manner can then be developed with commercial alkaline developers which may additionally contain alcohols, the exposed areas being selectively removed, whereas only a little material is removed in the unexposed areas.

In the Examples and Comparative Examples which follow, parts and percentages are by weight, unless stated otherwise.

EXAMPLE 1

A photoresist solution is prepared from 1.5 parts of tris-(4-tert-butoxycarbonyloxyphenyl)-sulfonium hexafluoroarsenate, 1.5 parts of novolak based on p-cresol/formaldehyde (softening point 78.5° C.) and having a mean molecular weight of 430 g/mol, 7.0 parts of polyp-hydroxystyrene having a mean molecular weight of 16,000 and 30 parts of methylpropylene glycol acetate. The meter of 0.2 μm.

The extinction of a 1 μm thick layer at 248 nm is 0.79. The resist solution is applied by spincoating at 4,600 revolutions per minute to a silicon wafer carrying an $SiO_2$ film, a layer thickness of 1.08 μm being obtained. The wafer is dried for 5 minutes at 80° C. and then brought into contact with an imagewise structured test mask and exposed for 10 seconds to excimer laser light having a wavelength of 248 nm. Thereafter, heating is carried out for 30 seconds at 100° C. and development with an alkaline developer of pH 13.12 is effected for 60 seconds. The exposed areas are completely removed, whereas removal of material from the unexposed areas is less than 5%. The resist patterns have a resolution of less than 1 μm. Without further aftertreatment, they show no flow of the structures on heating to 16° C.

COMPARATIVE EXAMPLE 1

Resist formulation without addition of novolak

A photoresist solution is prepared from 1.5 parts of tris-(4-tert-butoxycarbonyloxyphenyl)-sulfonium hexafluoroarsenate, 8.5 parts of poly-p-hydroxystyrene having a mean molecular weight of 16,000 and 30 parts of methylpropylene glycol acetate. The solution is then passed through a filter having a pore diameter of 0.2 μm.

The extinction of a 1 μm thick layer at 248 nm is 0.78. The resist solution is then applied by spincoating at 5,500 revolutions per minute to a silicon wafer carrying an $SiO_2$ film, a layer thickness of 0.99 μm being obtained. The wafer is dried for 5 minutes at 80° C. and then brought into contact with an imagewise structured test mask and exposed for 10 seconds to excimer laser light having a wavelength of 248 nm. Thereafter, heating is carried out for 30 seconds at 100° C. and development with an alkaline developer of pH 13.12 is effected for 60 seconds. The exposed areas are completely removed but removal of material from the unexposed areas is about 50%.

COMPARATIVE EXAMPLE 2

Resist formulation without poly-p-hydroxystyrene

A photoresist solution is prepared from 1.5 parts of tris-(4-tert-butoxycarbonyloxyphenyl)-sulfonium hexafluoroarsenate, 8.5 parts of a novolak based on p-cresol/formaldehyde and having a mean molecular weight of 430 g/mol and 20 parts of methylpropylene glycol acetate.

The solution is then passed through a filter having a pore diameter of 0.2 μm.

The extinction of a 1 μm thick layer at 248 nm is 0.86. The resist solution is then applied by spincoating at 3,000 revolutions per minute to a silicon wafer carrying an $SiO_2$ film, a layer thickness of 1.02 μm being obtained. The wafer is dried for 5 minutes at 80° C., then brought into contact with an imagewise structured test mask and exposed for 10 seconds to excimer laser light having a wavelength of 248 nm. Thereafter, heating is carried out for 30 seconds at 100° C. and development with an alkaline developer of pH 13.12 is effected for 60 seconds. The exposed areas are completely removed while removal of material from the unexposed areas is less than 5%. However, the resist patterns begin to flow at as low as 120° C.

EXAMPLES 2-4

The procedure described in Example 1 is followed, except that, instead of 1.5 parts of the novolak based on p-cresol and having a softening point of 78.5° C. according to DIN 52,011, 1.5 parts, in each case, of the novolaks based on p-cresol/formaldehyde and having softening points of 110° C. (Example 2), 121° C. (Example 3) and 133° C. (Example 4) are used. Good resist patterns are likewise obtained, removal of material in the unexposed areas being less than 2%.

We claim:

1. A radiation-sensitive mixture which contains
   (a) a water-insoluble binder which is soluble or at least dispersible in aqueous alkaline solutions and
   (b) organic compound whose solubility in an aqueous alkaline developer is increased by the action of an acid and which contains one or more acid-cleavable groups and in addition a further group which produces a strong acid on exposure to radiation,
   wherein the polymeric binder (a) contains a mixture of a phenolic polymer having a molecular weight of from 1,000 to 250,000 and a novolak resin having a molecular weight of from 300 to 20,000.

2. The radiation-sensitive mixture as claimed in claim 1, wherein the phenolic polymer of component (a) is poly-(p-hydroxystyrene), poly-(p-hydroxy-α-methylstyrene) or a copolymer of p-hydroxystyrene and p-hydroxy-α-methylstyrene.

3. The radiation-sensitive mixture as claimed in claim 1, wherein the resin of the novolak type of component (a) is a p-alkylphenyl/formaldehyde novolak resin or a predominantly o,o'-bonded phenol/formaldehyde novolak resin.

4. The radiation-sensitive mixture as claimed in claim 1, wherein the organic compound (b) is a sulfonium salt of the general formula (I)

where $R^1$ to $R^3$ are identical or different and are aliphatic and/or aromatic radicals which may contain heteroatoms, or two of the radicals R to R: are bonded to one another to form a ring, with the proviso that one or more of the radicals $R^1$ to $R^3$ contain one or more acid-cleavable groups, and $X^\ominus$ is a non-nucleophilic counter-ion.

5. The radiation-sensitive mixture as claimed in claim 1, which contains
   ($a_1$) from 40 to 90% by weight of the phenolic polymer,
   ($a_2$) from 5 to 40% by weight of a novolak resin and
   (b) from 5 to 20% by weight of a sulfonium salt of the formula (I),
with the proviso that the sum of the percentages stated under ($a_1$), ($a_2$) and (b) is 100, and the solids content of the mixture in an organic solvent may be from 5 to 40% by weight.

6. A process for the production of a relief pattern or relief image, which process comprises applying the radiation-sensitive mixture of claim 1 to a substrate, heating to remove residual solvent, subjecting the mixture to imagewise exposure, heating to 60°-120° C., and treating the mixture with an alkaline or polar solvent to remove the material in the exposed areas while leaving the material in the unexposed areas.

* * * * *

UNITED STATES PATENT AND TRADEMARK OFFICE
CERTIFICATE OF CORRECTION

PATENT NO. : 5,084,371

DATED : January 28, 1992

INVENTOR(S) : SCHWALM et al.

It is certified that error appears in the above-identified patent and that said Letters Patent is hereby corrected as shown below:

Col.7,

Claim 1, line 4, between "(b)" and "organic" insert --an--;

Columns 7-8,
Claim 2, 3, 4 and 5, line 1 of each claim, delete "as claimed in" and insert --of--.

Claim 4, column 8, line 15, delete "R to R" and insert --$R_1$ to $R_3$--.

column 8, line 18, delete "X$\theta$" and insert --$X^{\ominus}$--.

Signed and Sealed this

Twentieth Day of April, 1993

*Attest:*

MICHAEL K. KIRK

*Attesting Officer*  *Acting Commissioner of Patents and Trademarks*